United States Patent
Kong et al.

(10) Patent No.: US 6,399,792 B2
(45) Date of Patent: Jun. 4, 2002

(54) PHOTORESIST CROSS-LINKER AND PHOTORESIST COMPOSITION COMPRISING THE SAME

(75) Inventors: Keun Kyu Kong, Kwangju; Jae Chang Jung, Kyoungki-do; Myoung Soo Kim, Kyoungki-do; Hyoung Gi Kim, Kyoungki-do; Hyeong Soo Kim, Kyoungki-do; Ki Ho Baik, Kyoungki-do, all of (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/954,680

(22) Filed: Sep. 11, 2001

Related U.S. Application Data

(62) Division of application No. 09/501,096, filed on Feb. 9, 2000, now Pat. No. 6,312,868.

(30) Foreign Application Priority Data

Feb. 22, 1999 (KR) .............................. 99-5807

(51) Int. Cl.$^7$ ........................ C07D 325/00; G03F 7/004
(52) U.S. Cl. ..................... 549/510; 430/270.1
(58) Field of Search ................. 549/510; 430/270.1

(56) References Cited

U.S. PATENT DOCUMENTS

| 9,448,916 | 11/1999 | Jung et al. |
| 9,448,964 | 11/1999 | Jung et al. |
| 9,499,231 | 2/2000 | Jung et al. |
| 6,143,472 A | * 11/2000 | Sumino et al. |
| 6,312,868 B1 | * 11/2001 | Kong et al. |

* cited by examiner

Primary Examiner—T. A. Solola
(74) Attorney, Agent, or Firm—Townsend and Townsend and Crew LLP

(57) ABSTRACT

The present invention is directed to photoresist cross-linkers selected from the group consisting of a cross-linker monomer represented by following Chemical Formula 1, and homopolymers and copolymers thereof.

<Chemical Formula 1>

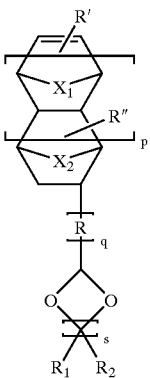

wherein $X^1$, $X^2$, R, R', R", $R_1$, $R_2$, p, q and s are those defined herein. Such cross-linkers are suitable for use in photolithography processes employing KrF(248 nm), ArF (193 nm), E-beam, ion-beam or EUV light sources.

2 Claims, 5 Drawing Sheets

PHOTORESIST CROSS-LINKER AND PHOTORESIST COMPOSITION COMPRISING THE SAME

CROSS-REFERENCE TO RELATED APPLICATION

This application is a divisional of U.S. patent application Ser. No. 09/501,096, filed on Feb. 9, 2000 now U.S. Pat. No. 6,312,868.

FIELD OF THE INVENTION

The present invention relates to cross-linking agents ("cross-linkers") usable for negative photoresist compositions and photoresist compositions comprising the same. More specifically, it relates to cross-linking agents used in photoresists suitable for photolithography processes using a KrF (248 um), ArF (193 rm), E-beam, ion beam or EUV light source when preparing a microcircuit of a highly integrated semiconductor element, and photoresist compositions employing the same.

BACKGROUND OF THE INVENTION

Recently, chemical amplification type DUV (deep ultra violet) photoresists have proven to be useful to achieve high sensitivity in processes for preparing micro-circuits in the manufacture of semiconductors. These photoresists are prepared by blending a photoacid generator with polymer matrix macromolecules having acid labile structures.

According to the reaction mechanism of such a negative photoresist, the photoacid generator generates acid when it is irradiated by the light source, and the main chain or branched chain of the polymer matrix macromolecule is cross-linked with the generated acid to form a cross-linked structure. Thus, the portion exposed to light cannot be dissolved by developing solution and remains unchanged, thereby producing a negative image of a mask on the substrate. In the lithography process, resolution depends upon the wavelength of the light source—the shorter the wavelength, the smaller the pattern that can be formed. However, when the wavelength of the light source is decreased in order to form a micro pattern [for example, in the case of using 193 nm wavelength or EUV (extremely ultraviolet) light], it is disadvantageous in that the lens of the exposing device is deformed by the light source, thereby shortening its life.

Melamine, a conventional cross-linker, has a limited number (three) of functional groups which can form a cross-linkage with acid. Further, a large amount of acid must be generated when melamine is used as a cross-linker, because acid is consumed by the cross-linking reaction. As a result, high-energy light exposure is required for such cross-linking agents.

In order to overcome the disadvantages described above, chemical amplification type compounds that cross-link with a photoresist resin (also referred to herein as a "photoresist resin") and use less amounts of energy are desirable. However, such chemical amplification type cross-linkers have not yet been developed.

SUMMARY OF THE INVENTION

The object of the present invention is to provide novel photoresist cross-linkers, and a process for the preparation thereof.

Another object of the present invention is to provide photoresist compositions comprising the cross-linkers, and a process for the preparation thereof.

Still another object of the present invention is to provide a semiconductor element manufactured from the photoresist composition.

DETAILED DESCRIPTION OF THE INVENTION

Figure 1:
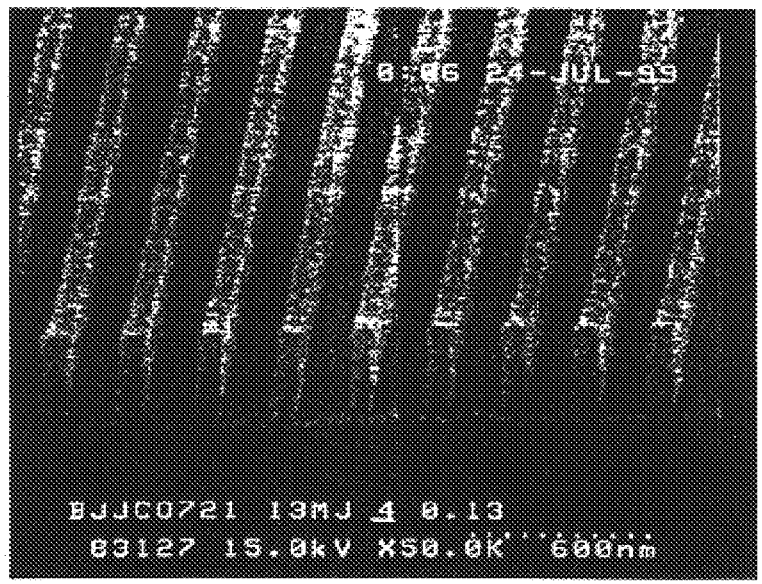
FIG. 1 to FIG. 10 show photoresist patterns prepared by using cross-linkers obtained from Examples 5 to 14.

In one aspect, the present invention provides a cross-linker monomer represented by the following Chemical Formula 1:

<Chemical Formula 1>

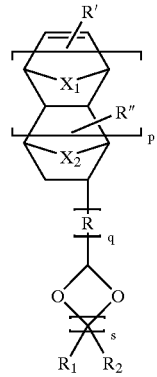

wherein $X_1$ and $X_2$ individually represent $CH_2$, $CH_2CH_2$, O or S; p and s individually represent an integer from 0 to 5; q is 0 or 1; R' and R" independently represent hydrogen or methyl; R represents straight or branched $C_{1-10}$ alkyl, straight or branched $C_{1-10}$ ether, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ether including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; $R_1$ and $R_2$ independently represent hydrogen, straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group.

The cross-linkers of the present invention may comprise a cross-linker monomer represented by the above Chemical Formula 1; a homopolymer thereof; or a copolymer thereof.

Preferably, the cross-linker is a copolymer of (i) the compound represented by Chemical Formula 1 as a first comonomer and (ii) maleic anhydride as a second comonomer. Particularly preferred cross-linkers further comprise (iii) (meth)acrylic acid as a third comonomer and the resulting copolymer is represented by the following Chemical Formula 7:

<Chemical Formula 7>

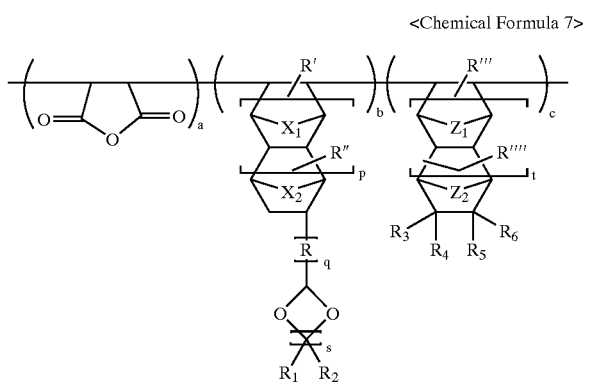

wherein $X_1$ and $X_2$ individually represent $CH_2$, $CH_2CH_2$, O or S; $Z_1$ and $Z_2$ individually represent $CH_2$, $CH_2CH_2$, O or S; p, s and t individually represent an integer from 0 to 5; q is 0 or 1; R', R'', R''' and R'''' independently represent hydrogen or methyl; R represents straight or branched $C_{1-10}$ alkyl, straight or branched $C_{1-10}$ ether, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ether including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; $R_1$, $R_2$, $R_3$, $R_4$, $R_5$ and $R_6$ independently represent hydrogen, straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; and a, b and c individually represent the relative amounts of each comonomer. The ratio a:b:c is preferably 0–90 mol%: 10–100 mol%: 0–90 mol%.

The present invention also provides a photoresist composition containing (i) a photoresist resin, (ii) a photoresist cross-linker as described above, (iii) a photoacid generator and (iv) an organic solvent.

The reaction mechanism of the cross-linkers according to the present invention is described below with reference to Reaction Scheme 1.

First, a cross-linker of the present invention is mixed with a photoresist polymer having hydroxyl groups, and the mixture is coated on a conventional semiconductor substrate (stage 1). Then, when a predetermined region of the substrate is exposed to light, the exposed portion generates acid (stage 2). Due to the acid generated from the exposed portion, the cross-linker of the present invention and the photoresist polymer combine together, and as a result of such cross-linking, acid is further generated. Since a cross-linkable hydroxyl group is regenerated on the cross-linker, continuous chain cross-linking is carried out (stage 3).

Reaction Scheme 1

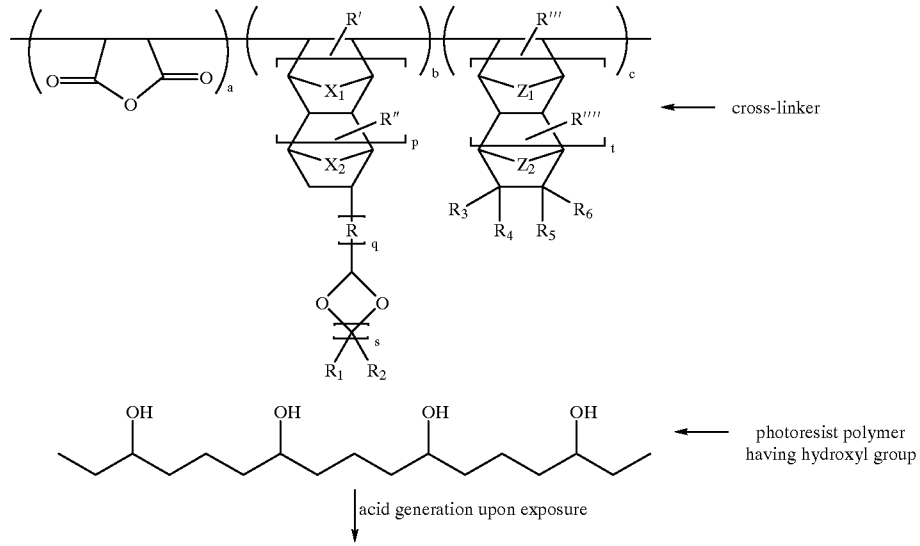

-continued
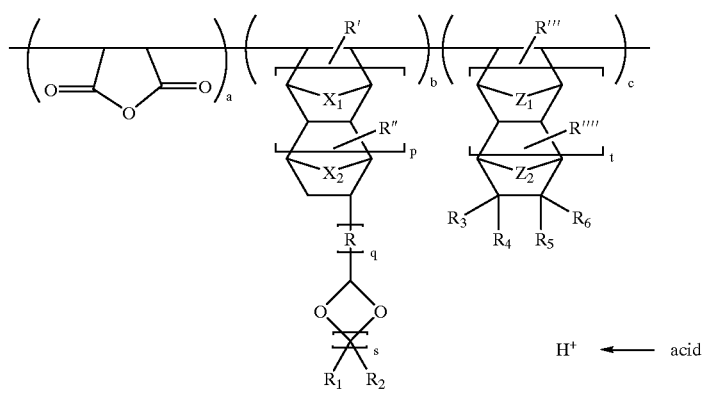
H⁺ ← acid
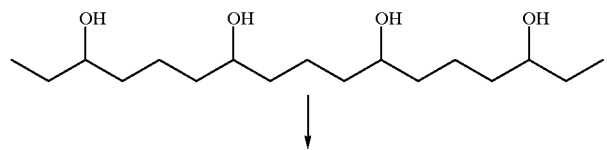
↓
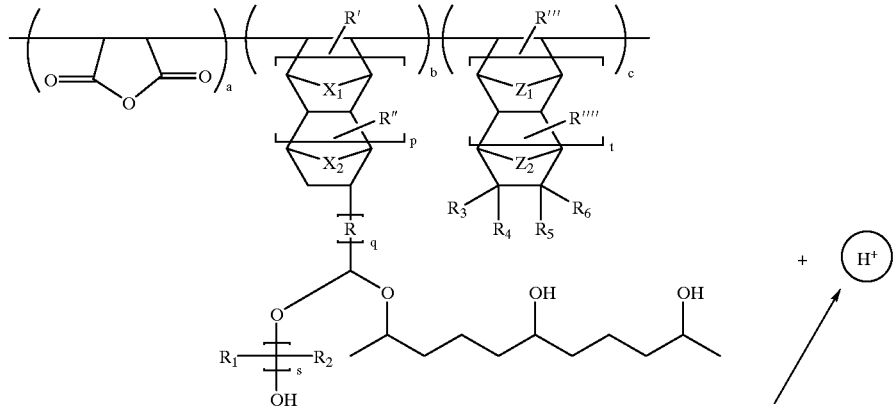
+ (H⁺)
↑
After cross-linking, cross-linkable hdyroxyl group (s) are regenerated
serves as a catalyst since acid is generated again after cross-linking (cross-linking of chemical amplification type)

wherein, $X_1$, $X_2$, $Z_1$, $Z_2$, p, q, s, t, R', R", R''', R"", $R_1$, $R_2$, $R_3$, $R_4$, $R_5$ and $R_6$ are as defined in Chemical Formulas 1 and 7.

Preparation of Cross-linker Monomer

The inventors have discovered that compounds represented by the following Chemical Formula 1 are good negative-type photoresist cross-linker monomers.

<Chemical Formula 1>

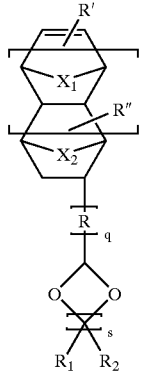

wherein $X_1$ and $X_2$ individually represent $CH_2$, $CH_2CH_2$, O or S; p and s individually represent an integer from 0 to 5; q is 0 or 1; R' and R" independently represent hydrogen or methyl; R represents straight or branched $C_{1-10}$ alkyl, straight or branched $C_{1-10}$ ether, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ether including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; $R_1$ and $R_2$ independently represent hydrogen, straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group.

Compounds of Chemical Formula 1 react with a photoresist polymer having hydroxyl group (—OH) in the presence of an acid to form a cross-link with the photoresist polymer. In addition, compounds of Chemical Formula 1 generate another acid as a result of the cross-linking reaction to induce a subsequent cross-linking reaction. Thus, the photoresist polymer in the exposed region can be densely hardened to obtain high resolution of the negative pattern. Accordingly, a photoresist composition with good photosensitivity can be prepared by using the cross-linker monomer of Chemical Formula 1.

The following examples demonstrate a desirable synthesizing method for photoresist cross-linker monomer according to the present invention:

EXAMPLE 1

0.5 mole of 5-norbornene-2-methanol (represented by the following Chemical Formula 3) and 200 ml of THF were put into a flask. 0.12 mole of pyridine was added, and then 0.1 mole of 2-(2-bromoethyl)-1,3-dioxoran of Chemical Formula 3 was added. The mixture was reacted for 1 to 2 days. After completion of the reaction, white solid salts and solvent were removed and the residue was distilled under reduced pressure to obtain a monomer represented by the following Chemical Formula 4:

<Chemical Formula 2>

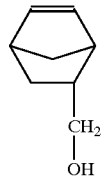

<Chemical Formula 3>

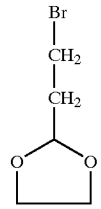

<Chemical Formula 4>

<Chemical Formula 4>

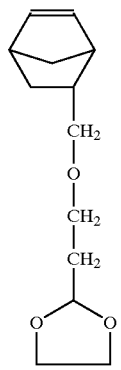

EXAMPLE 2

The procedure of Example 1 was repeated, but using 2-(2-bromoethyl)-1,3-dioxane (represented by Chemical Formula 5) instead of 2-(2-bromoethyl)-1,3-dioxoran of Chemical Formula 3, to obtain a monomer of the following Chemical Formula 6:

<Chemical Formula 5>

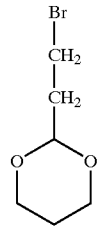

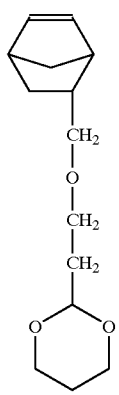

<Chemical Formula 6>

Preparation of Photoresist Cross-linker Copolymer

A photoresist cross-linker monomer according to the present invention can be used as a photoresist cross-linker by itself, or it can be used to form a polymer that can also be used as a photoresist cross-linker.

Preferably the cross-linker is a copolymer of (i) the compound represented by Chemical Formula 1 as a first comonomer and (ii) maleic anhydride as a second comonomer.

Chemical Formula 7 below represents a desirable photoresist cross-linker polymer according to the present invention.

<Chemical Formula 7>

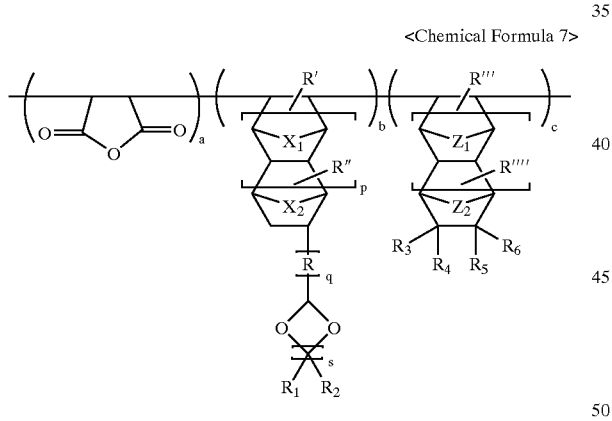

wherein $X_1$ and $X_2$ individually represent $CH_2$, $CH_2CH_2$, O or S; $Z_1$ and $Z_2$ individually represent $CH_2$, $CH_2CH_2$, O or S; p, s and t individually represent an integer from 0 to 5; q is 0 or 1; R', R'', R''' and R'''' independently represent hydrogen or methyl; R represents straight or branched $C_{1-10}$ alkyl, straight or branched $C_{1-10}$ ether, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ether including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; $R_1$, $R_2$, $R_3$, $R_4$, $R_5$ and $R_6$ independently represent hydrogen, straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, straight or branched $C_{1-10}$ alkyl including at least one hydroxyl group, straight or branched $C_{1-10}$ ester including at least one hydroxyl group, straight or branched $C_{1-10}$ ketone including at least one hydroxyl group, straight or branched $C_{1-10}$ carboxylic acid including at least one hydroxyl group, and straight or branched $C_{1-10}$ acetal including at least one hydroxyl group; and a, b and c individually represent the relative amounts of each comonomer. The ratio a:b:c is preferably 0–90 mol%: 10–100 mol%: 0–90 mol%.

EXAMPLE 3

0.1 mole of the cross-linker monomer of Chemical Formula 4 as a first monomer, 0 to 0.1 mole of maleic anhydride as a second monomer, and 0 to 0.5 mole of 5-norbornene-2-carboxylic acid of Chemical Formula 8 as a third monomer were mixed with 20 g of tetrahydrofuran in the presence of 0.2 g of polymerization initiator, AIBN, in a 200 ml flask. The mixture was reacted at 65° C. under nitrogen or argon for 8 hours. After completion of the polymerization, the resulting polymer was precipitated by ethyl ether solvent or distilled water to obtain the polymer of Chemical Formula 9:

<Chemical Formula 8>

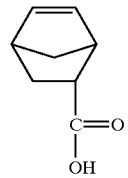

<Chemical Formula 9>

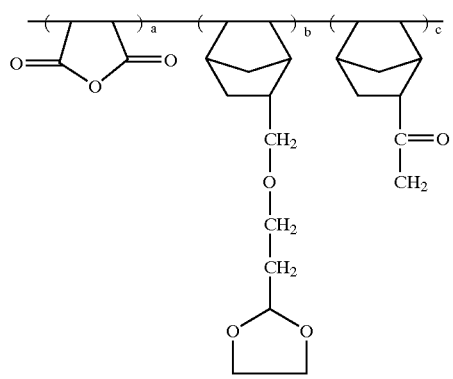

EXAMPLE 4

The procedure of Example 3 was repeated but using the cross-linker monomer of Chemical Formula 6 instead of cross-linker monomer of Chemical Formula 4 to obtain the polymer of Chemical Formula 10:

<Chemical Formula 10>

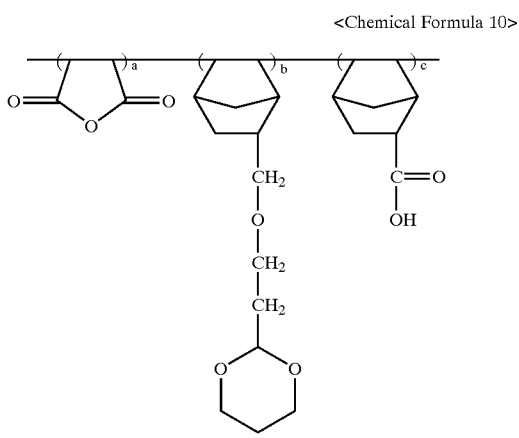

In Examples 3 and 4, AIBN was used as a polymerization initiator. However, any other conventional radical polymerization initiator, such as lauryl peroxide, can be used.

As a polymerization solvent, propylene glycol, toluene, methylether or acetate, etc. can be used instead of tetrahydrofuran.

Preparation of Photoresist Composition and Pattern Forming Process

The preparation process for a negative photoresist composition using the cross-linkers of the present invention will be described below:

Since the cross-linkers of the present invention are of the chemical amplification type, a photoresist composition of the present invention contains (i) a photoresist resin, (ii) a cross-linker according to the present invention (iii) a photoacid generator and (iv) an organic solvent for mixing them.

The above-mentioned photoresist resin may be a conventional photoresist polymer, preferably one that is suitable for use in a photolithography process employing extremely short-wavelength light (below 250 nm).

As the photoacid generator, conventional photoacid generators such as onium-type compounds, halogen-containing compounds, diazoketone compounds, sulfone, sulfonic acid and sulfonium compounds may be used, most preferably, sulfonium compounds. For example, the photoacid generator may be diphenyl iodide hexafluorophosphate, diphenyl iodide hexafluoroarsenate, diphenyliodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate or a mixture thereof.

As an organic solvent, 2-methoxyethylacetate, ethyl 3-ethoxypriopionate, methyl 3-methoxypropionate, cyclohexanone, propylene glycol methyl ether acetate, or the like may be used.

order to form a photoresist pattern using the photoresist composition thus prepared, the photoresist composition is spin-coated on a silicon wafer, and "soft-baked" in an oven or on hot-plate, at a temperature of about 70° C. to 200° C, preferably 80° C. to 150° C., for about 1 to 5 minutes. Then, the photoresist layer is exposed to 0.1 to 100 mJ/cm² of light energy using an exposer with ArF, KrF, E-beam, EUV or X-ray radiation, and "post-baked" at a temperature of about 70° C. to 200° C, preferably 100° C. to 200° C. Then, the wafer is developed by dipping the exposed wafer into an alkaline developing solution such as 0.01–5 wt % of TMAH (tetramethylammonium hydroxide) solution, preferably 2.38 wt % or 2.5 wt % TMAH solution, for a predetermined time, preferably about 40 seconds, to obtain a ultramicro photoresist pattern.

EXAMPLE 5

20 g of the photoresist resin of Chemical Formula 11, 10 g of the cross-linker of Chemical Formula 9 obtained from Example 3, and 0.6 g of triphenylsulforium triflate were dissolved in 200 g of propylene glycol methyl ether acetate to obtain a photoresist composition.

<Chemical Formula 11>

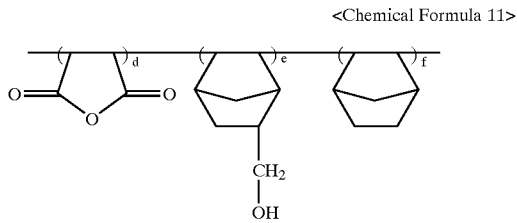

wherein d, e and f individually represent the relative amounts of each comonomer.

The photoresist composition thus prepared was coated on a silicone wafer, and soft-baked at 110° C. for 90 seconds. After baking, it was exposed to light by using an ArF exposer, and post-baked again at 110° C. for 90 seconds. The wafer was then developed in 2.38 wt % aqueous TMAH solution, to obtain a 0.13 μm L/S negative pattern (FIG. 1).

The results show that the hardening of the exposed region was excellent even though the exposure energy was merely 15 mJ/cm², due to the good cross-linking property of the cross-linker used.

EXAMPLE 6

Figure 2:
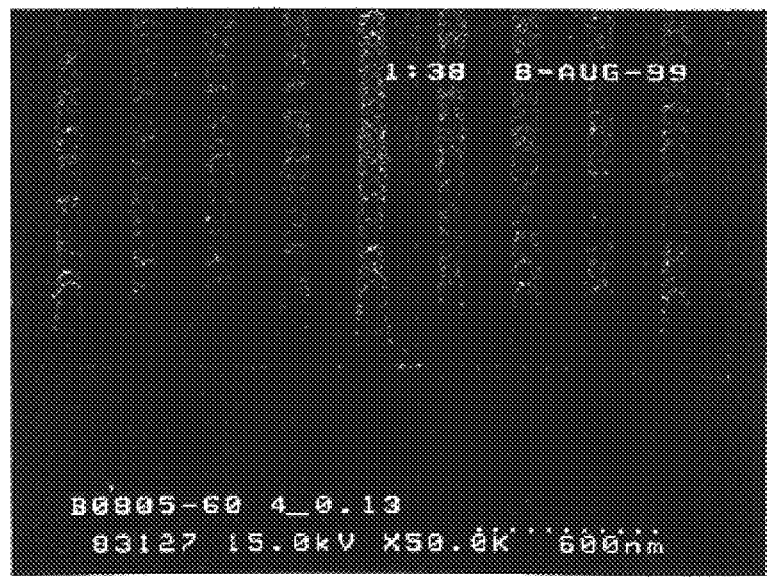

The procedure of Example 5 was repeated but using the photoresist resin of Chemical Formula 12 instead of the photoresist resin of Chemical Formula 11, to obtain a negative pattern with a resolution of 0.13 μm L/S (FIG. 2).

<Chemical Formula 12>

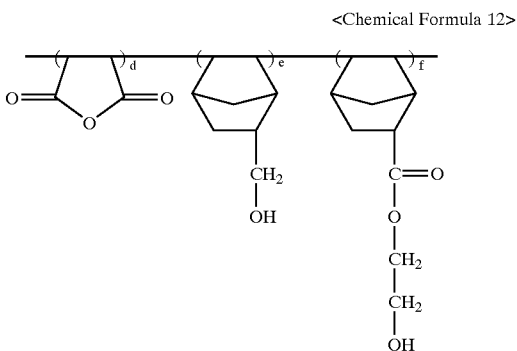

wherein d, e and f individually represent the relative amounts of each comonomer.

EXAMPLE 7

Figure 3:

The procedure of Example 5 was repeated but using the photoresist resin of Chemical Formula 13 instead of the photoresist resin of Chemical Formula 11, to obtain a negative pattern with a resolution of 0.13 μm L/S (FIG. 3).

<Chemical Formula 13>

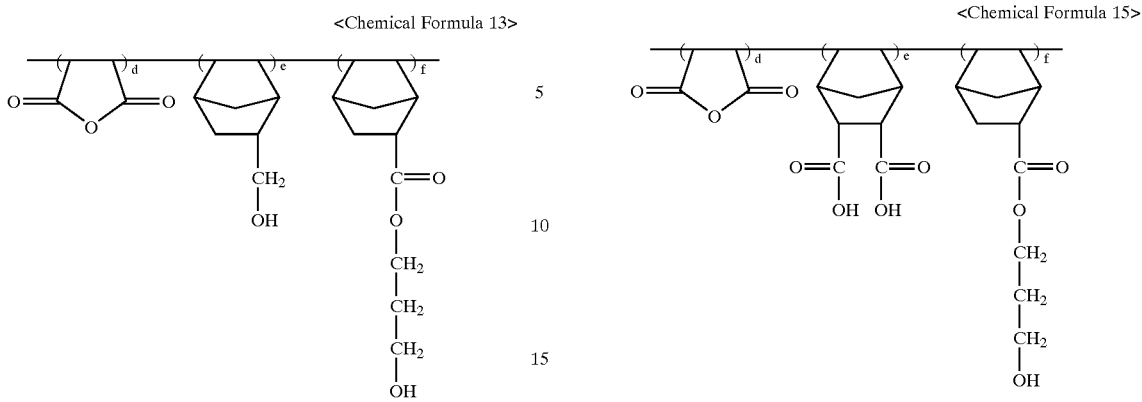

wherein d, e and f individually represent the relative amounts of each comonomer.

EXAMPLE 8

Figure 4:
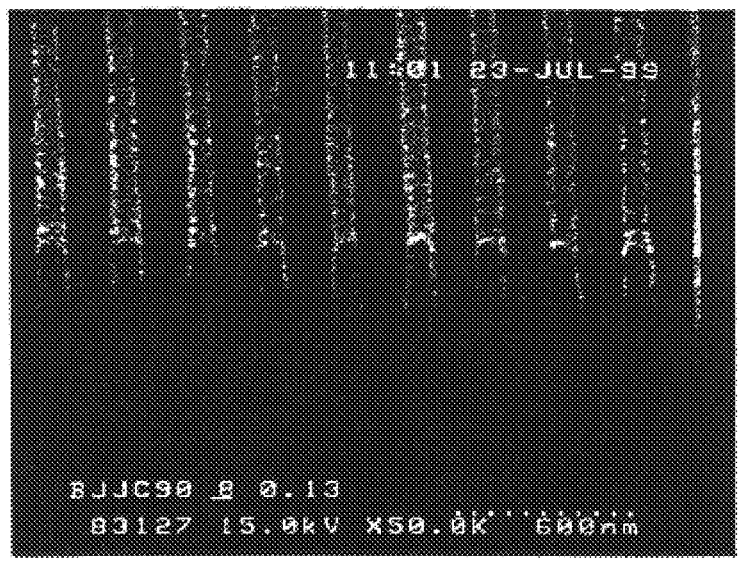

The procedure of Example 5 was repeated but using the photoresist resin of Chemical Formula 14 instead of the photoresist resin of Chemical Formula 11, to obtain a negative pattern with a resolution of 0.13 μm L/S (FIG. 4).

<Chemical Formula 14>

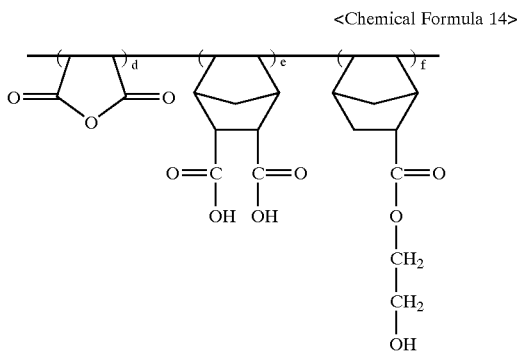

wherein d, e and f individually represent the relative amounts of each comonomer.

EXAMPLE 9

Figure 5:
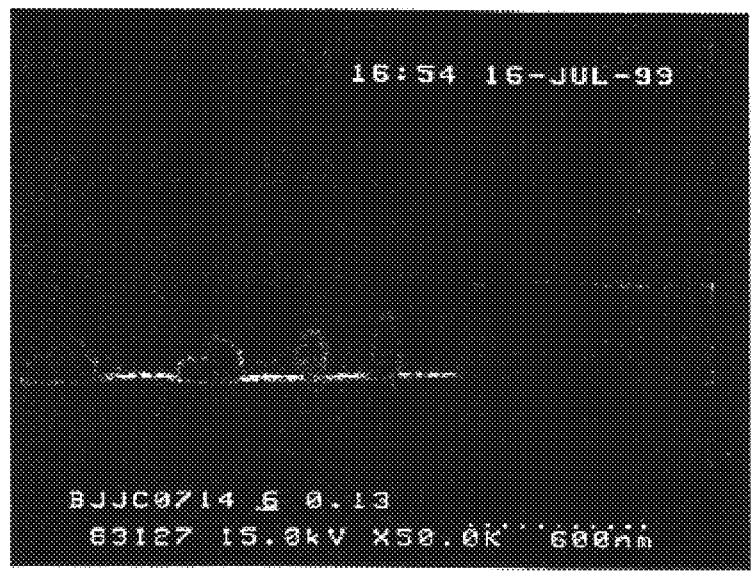

The procedure of Example 5 was repeated but using the photoresist resin of Chemical Formula 15 instead of the photoresist resin of Chemical Formula 11, to obtain a negative pattern with a resolution of 0.13 μm L/S (FIG. 5).

<Chemical Formula 15> wherein d, e and f individually represent the relative amounts of each comonomer.

EXAMPLE 10

Figure 6:
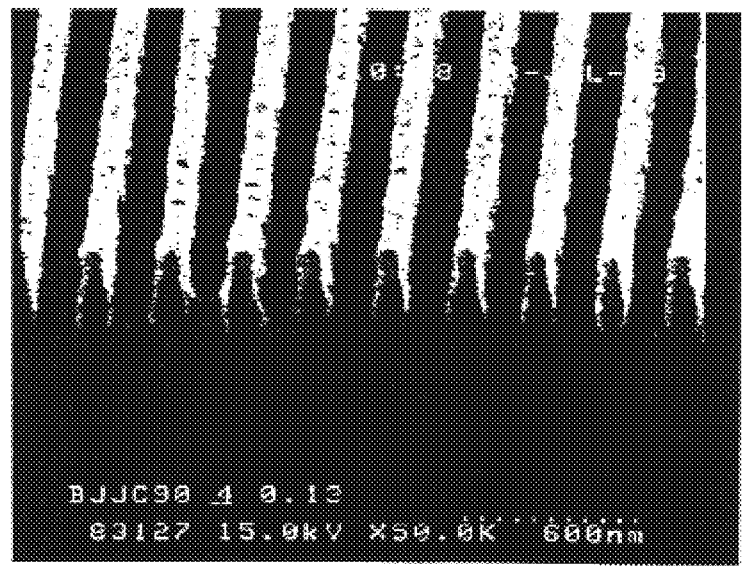

The procedure of Example 5 was repeated but using the cross-linker of Chemical Formula 6 obtained from Example 4 instead of the cross-linker of Chemical Formula 4 obtained from Example 3, to obtain a negative pattern with a resolution of 0.13 μm L/S (FIG. 6).

EXAMPLE 11

Figure 7:
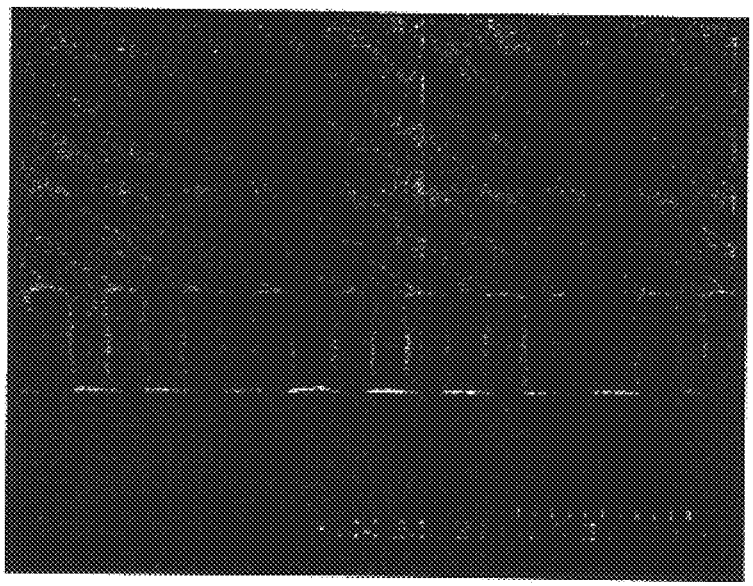

The procedure of Example 6 was repeated but using the cross-linker of Chemical Formula 6 obtained from Example 4 instead of the cross-linker of Chemical Formula 4 obtained from Example 3, to obtain a negative pattern with a resolution of 0.13 μm L/S (FIG. 7).

EXAMPLE 12

Figure 8:
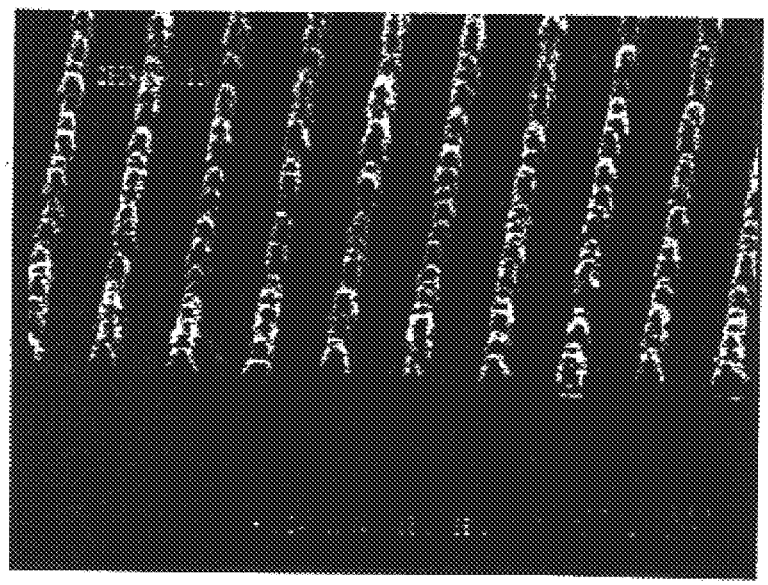

The procedure of Example 7 was repeated but using the cross-linker of Chemical Formula 6 obtained from Example 4 instead of the cross-linker of Chemical Formula 4 obtained from Example 3, to obtain a negative pattern with a resolution of 0.13 μm L/S (FIG. 8).

EXAMPLE 13

Figure 9:
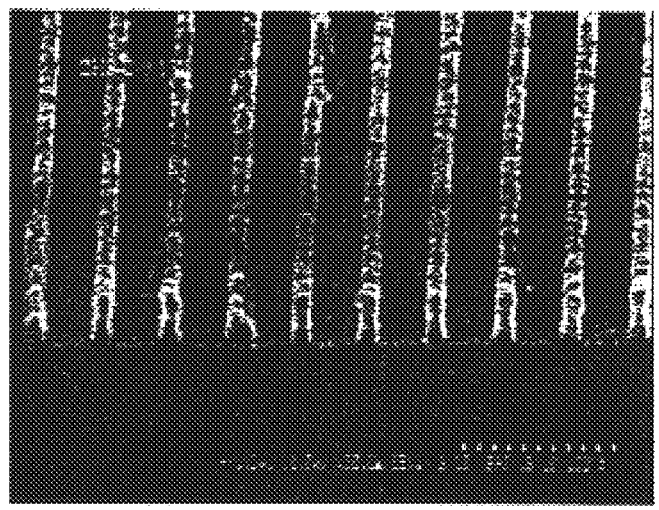

The procedure of Example 8 was repeated but using the cross-linker of Chemical Formula 6 obtained from Example 4 instead of the cross-linker of Chemical Formula 4 obtained from Example 3, to obtain a negative pattern with a resolution of 0.13 μm L/S (FIG. 9).

EXAMPLE 14

Figure 10:
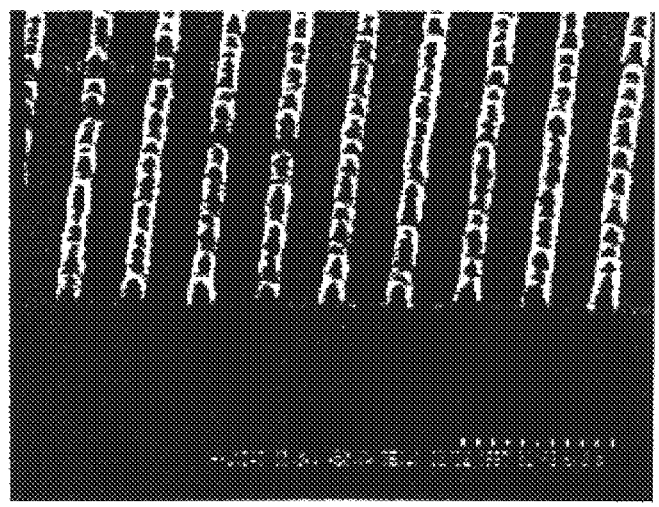

The procedure of Example 9 was repeated but using the cross-linker of Chemical Formula 6 obtained from Example 4 instead of the cross-linker of Chemical Formula 4 obtained from Example 3, to obtain a negative pattern with a resolution of 0.13 μm L/S (FIG. 10).

As described above, the photoresist cross-linker according to the present invention has high cross-linking ability. Thus, a photoresist containing the cross-linker exhibits an outstanding difference in curing between exposed regions and non-exposed regions which makes it possible to form a fine pattern with good profile. In addition, since the photoresist cross-linker is of the chemical amplification type, it is possible to obtain the desired effect using a small amount of photoacid generator, which solves the problems caused by a large amount of photoacid generator being contained in the photoresist composition. Furthermore, since the photoresist cross-linker according to the present invention has high light-sensitivity, it is possible to obtain a sufficient exposure effect with a small quantity of light radiation. Accordingly, a photoresist composition containing the cross-linker of the present invention is suitable for use in a photolithography process employing extremely short wavelength light, such as ArF (193 nm).

What is claimed is:

1. A photoresist cross-linker monomer represented by the following Chemical Formula 1:

<Chemical Formula 1>

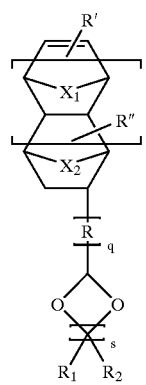

wherein
$X_1$ and $X_2$ are independently $CH_2$, $CH_2CH_2$, O or S;
p and s are independently an integer from 0 to 5;
q is 0 or 1;
R' and R" are independently hydrogen or methyl;
R represents straight or branched $C_{1-10}$ alkylene, straight or branched $C_{1-10}$ ether, straight or branched $C_{1-10}$ ketone, straight or branched $C_{1-10}$ acetal, substituted straight or branched $C_{1-10}$ alkylene wherein at least one substituent is an hydroxyl group, substituted straight or branched $C_{1-10}$ ether wherein at least one substituent is an hydroxyl group, substituted straight or branched $C_{1-10}$ ester wherein at least one substituent is an hydroxyl group, substituted straight or branched $C_{1-10}$ ketone wherein at least one substituent is an hydroxyl group, substituted straight or branched $C_{1-10}$ carboxylic acid wherein at least one substituent is an hydroxyl group, and substituted straight or branched $C_{1-10}$ acetal wherein at least one substituent is an hydroxyl group; and
$R_1$ and $R_2$ are independently hydrogen, straight or branched $C_{1-10}$ alkyl, straight or branched $C_{1-10}$ ester, straight or branched $C_{1-10}$ ketone, straight or branched $C_{1-10}$ carboxylic acid, straight or branched $C_{1-10}$ acetal, substituted straight or branched $C_{1-10}$ alkyl wherein at least one substituent is an hydroxyl group, substituted straight or branched $C_{1-10}$ ester wherein at least one substituent is an hydroxyl group, substituted straight or branched $C_{1-10}$ ketone wherein at least one substituent is an hydroxyl group, substituted straight or branched $C_{1-10}$ carboxylic acid wherein at least one substituent is an hydroxyl group, and substituted straight or branched $C_{1-10}$ acetal wherein at least one substituent is an hydroxyl group.

2. A photoresist cross-linker monomer according to claim 1 selected from the group consisting of the compounds represented by following Chemical Formulas 4 and 6:

<Chemical Formula 4>

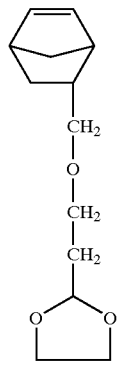

<Chemical Formula 6>

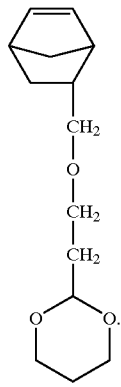

* * * * *